US008442602B2

(12) United States Patent
Wong et al.

(10) Patent No.: US 8,442,602 B2
(45) Date of Patent: May 14, 2013

(54) RADIATION REDIRECTING EXTERNAL CASE FOR PORTABLE COMMUNICATION DEVICE AND ANTENNA EMBEDDED IN BATTERY OF PORTABLE COMMUNICATION DEVICE

(75) Inventors: Alfred Y. Wong, Los Angeles, CA (US); Robert Moreno, Acton, CA (US); Karl Richard Shields, North Hills, CA (US); Rong Wang, Sherman Oaks, CA (US)

(73) Assignee: Pong Research Corporation, Leesburg, VA (US)

( * ) Notice: Subject to any disclaimer, the term of this patent is extended or adjusted under 35 U.S.C. 154(b) by 0 days.

(21) Appl. No.: 13/491,747

(22) Filed: Jun. 8, 2012

(65) Prior Publication Data

US 2012/0309472 A1     Dec. 6, 2012

Related U.S. Application Data

(63) Continuation of application No. 12/614,132, filed on Nov. 6, 2009, now Pat. No. 8,208,980.

(60) Provisional application No. 61/112,141, filed on Nov. 6, 2008, provisional application No. 61/158,551, filed on Mar. 9, 2009.

(51) Int. Cl.
*H04Q 7/32*     (2006.01)

(52) U.S. Cl.
USPC ............... 455/575.5; 455/575.1; 455/550.1; 455/67.11; 455/90.3; 455/557; 343/702; 343/718; 343/720; 343/782

(58) Field of Classification Search ............... 455/575.5, 455/575.1, 550.1, 552.1, 553.1, 422.1, 403, 455/445, 67.11, 426.1, 426.2, 41.1, 41.2, 455/90.3; 343/702, 718, 720, 782; 320/114, 320/110
See application file for complete search history.

(56) References Cited

U.S. PATENT DOCUMENTS

| 5,278,571 A | 1/1994 | Helfrick |
| 5,338,896 A | 8/1994 | Danforth |

(Continued)

FOREIGN PATENT DOCUMENTS

| EP | 1 292 042 A2 | 3/2003 |
| EP | 1 942 580 A2 | 7/2008 |

(Continued)

OTHER PUBLICATIONS

Office Action for U.S. Appl. No. 12/614,132, mailed Oct. 20, 2011.

(Continued)

*Primary Examiner* — Keith Ferguson

(57) ABSTRACT

An antenna or set of antennae for a wireless device is provided by embedding the antennae into the battery case or generally the surface area of a wireless phone. The antenna connections are through the battery's connections to the wireless device. The antenna can be located at the back surface of the battery or the rear surface of a wireless phone, facing away from the user. An RF shielding device can be embedded into the battery and configured in relation to the antenna such that the RF field intensity and the consequent specific absorption rate for the user is lowered while the outgoing signals of the wireless device remain fully adequate for the function of the wireless device. This feature is preserved for a multi-band operation because a digital phase shifter is used between two radiating antennae. An external case is used as a complement to the wireless phone.

20 Claims, 13 Drawing Sheets iPHONE WITH PONG HYBRID ACTIVE RF SHIELDING AND OPTIMIZATION

U.S. PATENT DOCUMENTS

| | | | |
|---|---|---|---|
| 5,550,552 A | 8/1996 | Oxley | |
| 5,711,014 A | 1/1998 | Crowley et al. | |
| 5,726,383 A | 3/1998 | Geller et al. | |
| 5,777,261 A | 7/1998 | Katz | |
| 5,787,340 A | 7/1998 | Sepponen | |
| 6,031,495 A * | 2/2000 | Simmons et al. | 343/702 |
| 6,082,535 A | 7/2000 | Mitchell | |
| 6,249,256 B1 | 6/2001 | Luxon et al. | |
| 6,341,217 B1 | 1/2002 | Wong | |
| 6,359,213 B1 | 3/2002 | Long | |
| 6,492,957 B2 | 12/2002 | Carillo, Jr. et al. | |
| 6,515,223 B2 | 2/2003 | Tashjian | |
| 6,568,576 B1 | 5/2003 | Godshaw et al. | |
| 6,576,832 B2 | 6/2003 | Svarfvar et al. | |
| 6,603,981 B1 | 8/2003 | Carillo, Jr. et al. | |
| 6,615,026 B1 | 9/2003 | Wong | |
| 6,711,387 B1 | 3/2004 | Lungley | |
| 6,768,523 B2 | 7/2004 | Cheng et al. | |
| 6,855,883 B1 | 2/2005 | Matsui | |
| 6,856,819 B2 | 2/2005 | Itoh | |
| 6,871,079 B1 | 3/2005 | Choi et al. | |
| 6,880,737 B2 | 4/2005 | Bauer | |
| 6,924,770 B2 | 8/2005 | Carpenter et al. | |
| 6,947,000 B2 | 9/2005 | Ito | |
| 6,950,674 B2 | 9/2005 | Jarrett | |
| 6,980,777 B2 | 12/2005 | Shepherd et al. | |
| 6,985,110 B2 | 1/2006 | Tanaka et al. | |
| 7,031,762 B2 | 4/2006 | Shoji et al. | |
| 7,065,379 B1 | 6/2006 | Kim et al. | |
| 7,164,933 B1 | 1/2007 | Steigerwald et al. | |
| 7,202,825 B2 | 4/2007 | Leizerovich et al. | |
| 7,206,618 B2 | 4/2007 | Latto | |
| 7,230,574 B2 | 6/2007 | Johnson | |
| 7,327,841 B2 | 2/2008 | Schreiber et al. | |
| 7,812,770 B2 | 10/2010 | Qi et al. | |
| 8,068,061 B2 | 11/2011 | Qi et al. | |
| 2002/0009976 A1 | 1/2002 | Rashidi | |
| 2002/0074142 A1 | 6/2002 | Katz | |
| 2002/0183013 A1 | 12/2002 | Auckland et al. | |
| 2002/0193136 A1 | 12/2002 | Halkosaari et al. | |
| 2003/0078037 A1 | 4/2003 | Auckland et al. | |
| 2004/0014506 A1 | 1/2004 | Kemppinen | |
| 2005/0079820 A1 | 4/2005 | Yamashita | |
| 2005/0104782 A1 | 5/2005 | Peled et al. | |
| 2005/0195119 A1 | 9/2005 | Gaucher et al. | |
| 2006/0019696 A1 | 1/2006 | Brunel et al. | |
| 2006/0022889 A1 | 2/2006 | Chiang et al. | |
| 2006/0232483 A1 | 10/2006 | Iwai et al. | |
| 2006/0290575 A1 | 12/2006 | Pelzer | |
| 2007/0004456 A1 | 1/2007 | Shimada | |
| 2007/0241977 A1 | 10/2007 | Vance | |
| 2008/0165064 A1 | 7/2008 | Hill et al. | |
| 2009/0124215 A1 | 5/2009 | Nysen | |
| 2009/0156151 A1 | 6/2009 | Anguera et al. | |
| 2009/0318094 A1 | 12/2009 | Pros et al. | |
| 2010/0113111 A1 | 5/2010 | Wong et al. | |
| 2010/0214180 A1 | 8/2010 | Krogerus | |
| 2010/0216520 A1 | 8/2010 | Lee | |
| 2010/0234081 A1 | 9/2010 | Wong et al. | |
| 2010/0291965 A1 | 11/2010 | Tabe | |
| 2011/0012794 A1 | 1/2011 | Schlub | |
| 2011/0036912 A1 | 2/2011 | Guo et al. | |
| 2011/0109515 A1 | 5/2011 | Rao | |
| 2011/0140982 A1 | 6/2011 | Ozden et al. | |
| 2012/0044115 A1 | 2/2012 | McCaughey et al. | |

FOREIGN PATENT DOCUMENTS

| | | |
|---|---|---|
| WO | WO 00/13330 | 3/2000 |
| WO | WO 01/35487 A1 | 5/2001 |
| WO | WO 02/095867 A1 | 11/2002 |
| WO | WO 03/028424 A1 | 4/2003 |

OTHER PUBLICATIONS

Final Office Action for U.S. Appl. No. 12/614,132, mailed Mar. 1, 2012.
Office Action for U.S. Appl. No. 12/724,290, mailed Nov. 9, 2011.
International Search Report and Written Opinion for International Application No. PCT/US2009/063618, mailed Mar. 1, 2010.
Patent Examination Report No. 1 for Australian Application No. 2009313338, mailed Mar. 6, 2013.
International Search Report and Written Opinion for International Application No. PCT/US2012/062995, mailed Mar. 8, 2013.

* cited by examiner

RADIATION REDIRECTING EXTERNAL CASE FOR PORTABLE COMMUNICATION DEVICE AND ANTENNA EMBEDDED IN BATTERY OF PORTABLE COMMUNICATION DEVICE

CROSS REFERENCE TO RELATED APPLICATIONS AND CLAIM FOR PRIORITY

This application is a continuation of U.S. patent application Ser. No. 12/614,132, entitled "RADIATION REDIRECTING EXTERNAL CASE FOR PORTABLE COMMUNICATION DEVICE AND ANTENNA EMBEDDED IN BATTERY OF PORTABLE COMMUNICATION DEVICE," filed on Nov. 6, 2009, (now U.S. Pat. No. 8,208,980), which claims priority to and the benefit of Provisional Application Ser. No. 61/112,141 filed Nov. 6, 2008, and Provisional Application Ser. No. 61/158,551 filed Mar. 9, 2009, all of which are incorporated herein by reference in their entirety.

BACKGROUND OF THE INVENTION

1. Field of the Invention

This invention relates generally to portable communication devices such as cell phones, smart phones and similar handheld devices, and improvements thereto. In particular, this invention provides improvements in antennas and RF shielding of such devices, the embedding of an antenna into the removable battery of a portable communication device, or any large surface area inside a phone, facing a direction away from the user, to redirecting RF radiation away from the body of a user, and to several methods of exploiting technical advantages that result from embedding an antenna into the battery.

2. Background

Design requirements of cellular phones and smart phones are placing an ever increasing premium on the available space within these devices as their functions become more diverse, ranging from the original basic function as a wireless telephone to a music player, video player, handheld computer, wireless internet device for browsing the web, retrieving email and downloading or uploading files, a still camera, a video camera, a GPS device, a navigation system, etc. These functions bring with them greatly increased demands upon the antenna and generally requires more radiation power for transmission, which must serve up to five frequency bands while occupying less space than ever before available for the antenna.

In addition, RF radiation from mobile phones is becoming of greater concern as a health risk, and addressing this issue in the design of the antenna while the space within the phone is reduced poses a particularly difficult challenge, as the only effective methods of significantly reducing RF radiation in the direction of the user, while allowing full power RF signal away from the user, require some additional space for the antenna.

The FCC requires limiting the radiation from a portable communication device (such as a mobile or cellular telephone) that is directed towards a user's head (Specific Absorption Rate, or SAR). Each year the FCC tends to lower the permitted level further. One of the reasons is safety. At the same time, as wireless communications technology advances, the mobile phone device has taken on the function of a hand-held computer with more data-intensive functions, requiring high rates of data transfer between the cell phone and the base station tower. It would be beneficial to the improved function of cell phones to be able to increase the power output of the antenna, but FCC regulations will not allow increased SAR.

The Smart Phone (e.g. iPhone, BlackBerry, etc.), for example, has an internal antenna(s) located at both the lower and upper parts of the phone, bordering the display area. The space for an antenna is usually limited to 1 cm times the width and thickness of the phone. The antenna is situated close to the back surface of the phone, on the side opposite to the user.

SUMMARY OF THE INVENTION

According to a first embodiment, the present invention dramatically increases the effective space for the antenna and provides highly effective shielding and RF radiation redirection away from the user, while actually increasing the available space within the phone casing. The invention incorporates the antenna into the battery such that the antenna lies on the side of the battery facing away from the user, where the battery is attached to the back of the phone facing away from the user. The battery's electrical connections are increased to include all the needed antenna leads into the phone's circuits. All batteries designed for a particular model of phone would feature the antenna built-in.

One advantage of this design is to afford far more space for the complex antennas of the future, aiding in their optimization. Separate antennas can be employed within the battery, utilizing the relatively larger area available on the battery to provide separation of antennas of different frequencies and functions, thereby reducing interference between the antennas. Another important advantage of this configuration is that it permits optimization of an RF shielding design for wireless phones. The thickness of the battery can serve to provide the needed space between the antenna and a tuned RF shielding element placed within the battery on the side nearest the user, with the lithium ion core or other functional storage medium of the battery lying between the shielding and the antenna. The resulting spacing between the RF shielding and the antenna is optimally one-quarter of the wavelength of the transmission signal. This goal can be aided by the use of a layer of dielectric material between the RF shielding and the antenna, but is still extremely difficult to achieve in the small space allowed inside the phone case. By designing the battery such that the thickness of the battery's storage medium results in the correct spacing for the tuning of the RF shielding, and by grounding the shielding through a connector from the battery to the phone's ground circuit, and by designing the RF shielding itself to optimally redirect the RF radiation away from the user while leaving undiminished the desired signal directed away from the user, a unique benefit of significant reduction in RF absorption by the user's body can be achieved.

An alternate way of redirection is to use two antennas phased appropriately to radiate waves in a direction away from the user. This can be achieved in two ways:

1. Place two antennas one on each side of the battery. Each antenna is connected to the output power. The phase between these antennas is controlled digitally to give the optimum direction outward. Micro-processor with very low power requirement (microwatt) is available for this digital control. The power for such control can be derived from capturing the radiation power from the phone.

2. This configuration is ideal for multiple-band applications. For each frequency used the phase is programmed to give the optimum propagation characteristics. This will make it unnecessary to have a material of high dielectric constant.

The same principle can be used where one antenna is located in the cell phone case and another antenna inside the phone or on/in the battery. In general, two or more antennas are preferred to direct the radiation from a wireless phone.

According to a second aspect of the invention, radiation from a portable communication device is directed away from the user such that there is minimum effect on the performance of the device. The end result is a low SAR and an unchanged TRP (Total Radiation Power). This is accomplished by coupling radiation from the antenna inside a wireless phone to an external case. The external case is provided with a shield comprising a metallic surface that is corrugated. Such a shield may also be installed inside the wireless device.

DETAILED DESCRIPTION OF THE INVENTION

Antenna Embedded into Battery or Wireless Devices

Figure 1:
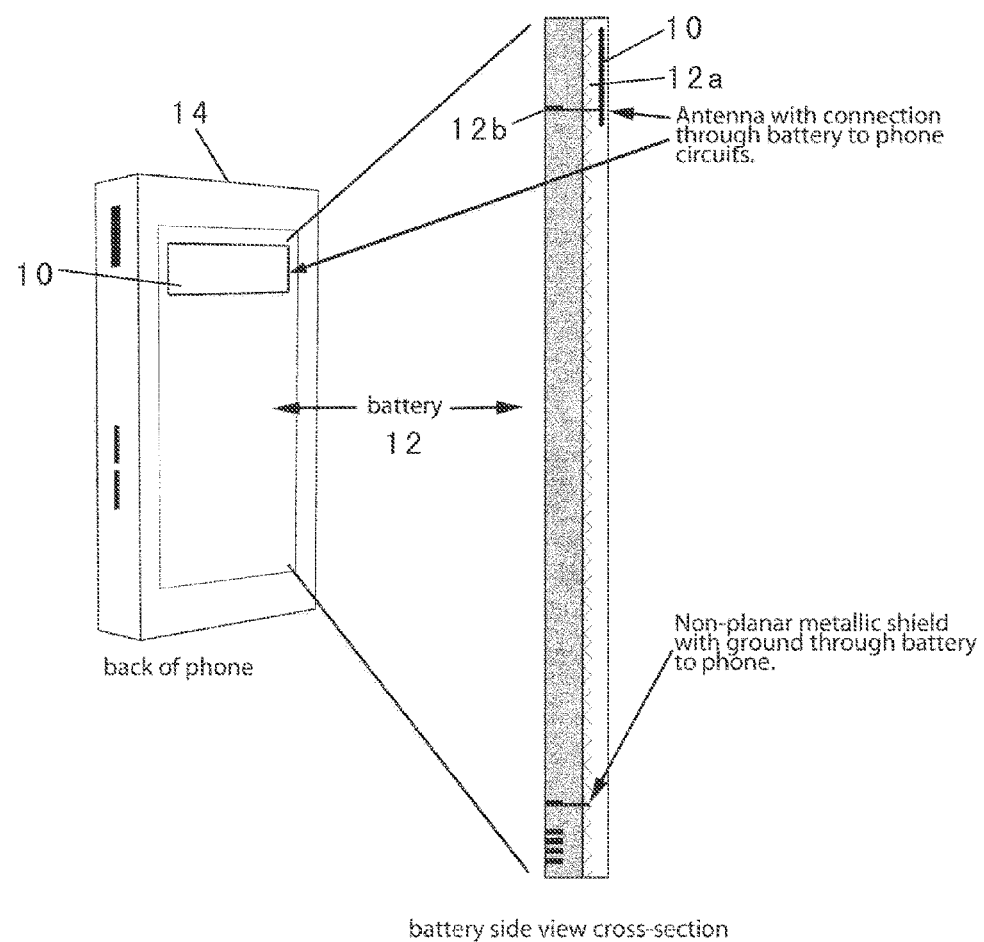
FIG. 1 shows an antenna embedded into a battery and the antenna connections from the battery casing to the phone circuits, with the antenna designed as a compact unit located at the upper end of the battery.
Figure 2:
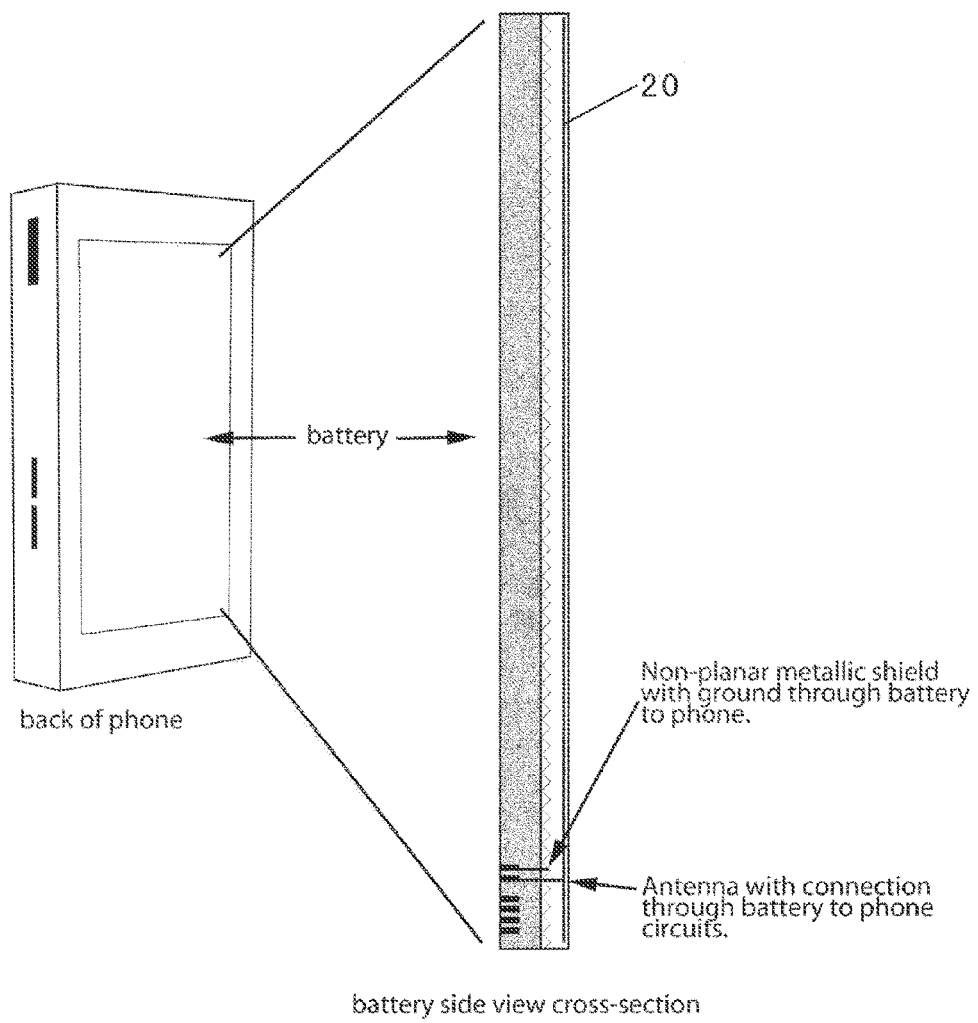
FIG. 2 shows an antenna embedded into a battery and the antenna connections from the battery casing to the phone circuits, with the antenna designed as a thin flat unit located on the planar surface in the back of the battery.

According to first aspect of the invention as shown in FIG. 1, an antenna 10 for a wireless device 14 is embedded into the battery 12, such that the space inside the wireless device formerly occupied by the antenna is available for other components, and the antenna is connected to the wireless device's antenna circuit by electrical contact surfaces 12a on the battery casing that contact corresponding surfaces 12b on the phone case, in the same manner as the power connections are made from the battery to the phone's power circuit. The antenna may be of compact design and fitted into one end or side of the battery casing, as shown in FIG. 1. Optionally, the antenna may be made thin and flat and may be placed on the broad flat plane parallel to the battery's energy storage core as shown in FIG. 2 as antenna 20.

Figure 3:
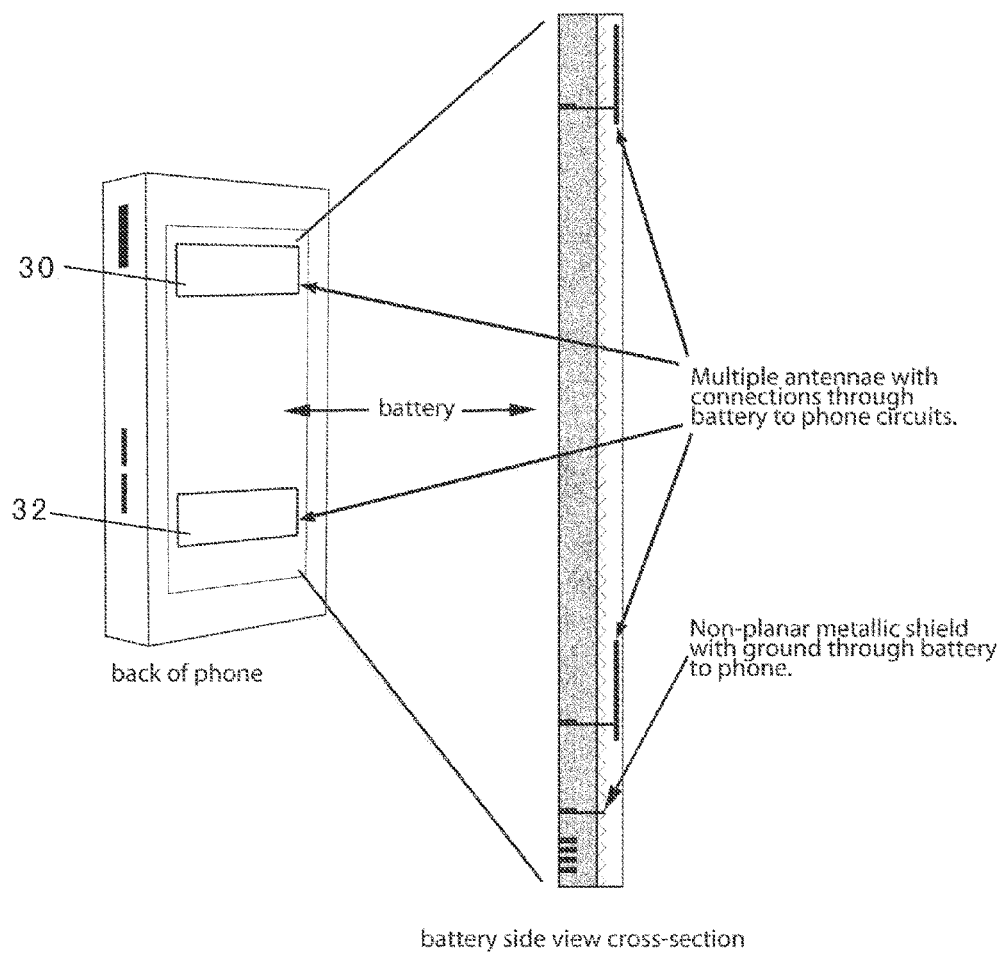
FIG. 3 shows separate antennas of different frequency and purpose located apart from one another in separate areas of the battery.

As shown in FIG. 3, separate antennas 30 and 32 of different frequencies may be provided on the battery located apart from one another in various areas within the battery. For example, one antenna 30 may be designed for quadband performance, and another separate GPS antenna 32 may be added in another area of the battery case with its own circuit and connections through to the wireless device.

Figure 4:
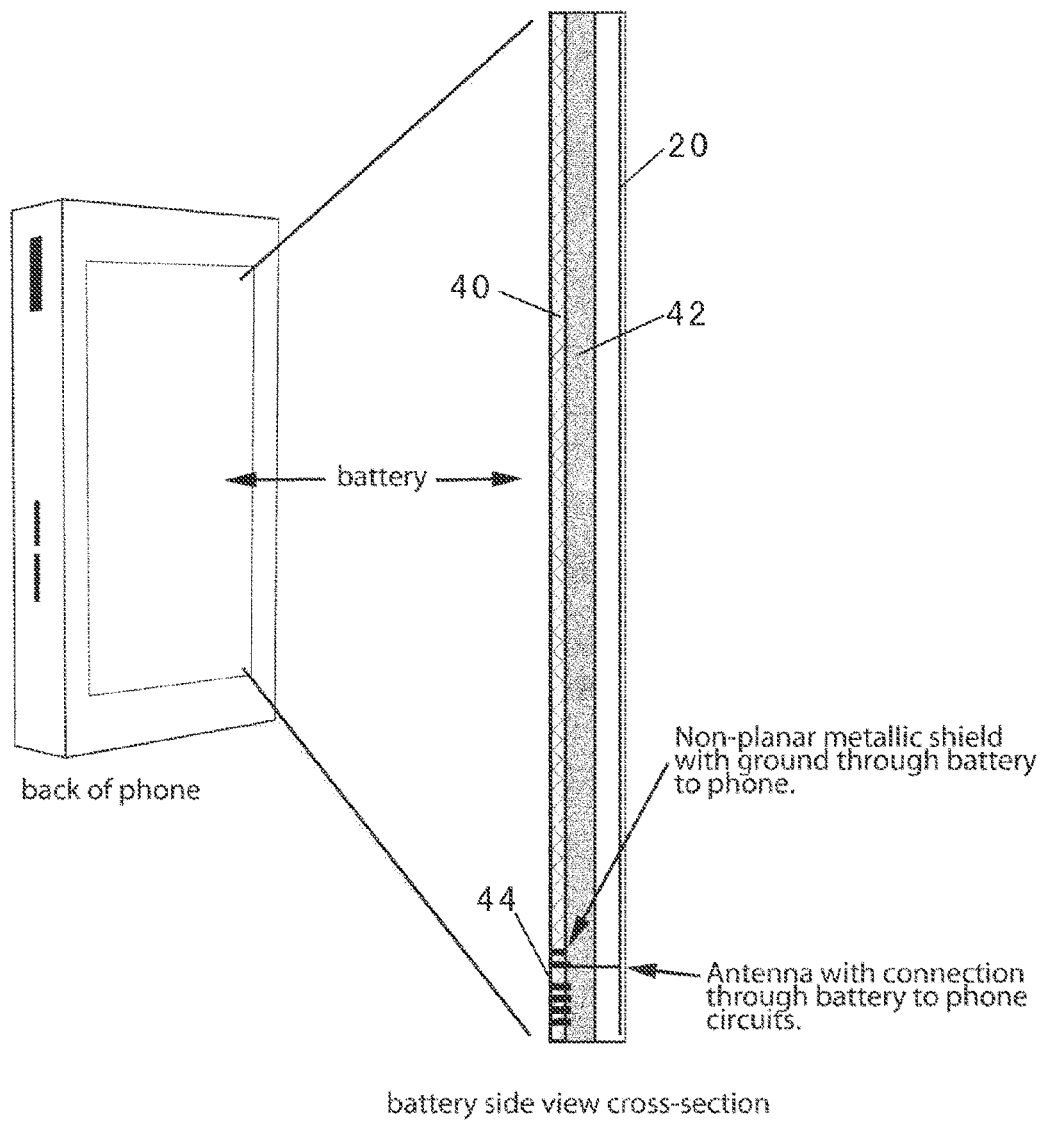
FIG. 4 shows an RF radiation shield embedded into the battery, such that the shielding is on the side of the battery nearest the user while the antenna in on the side of the battery farthest from the user in the same flat planar configuration as shown in FIG. 2. Also shown in FIG. 2 is the ground connection for the shielding through the battery to the phone's ground circuit.

In another embodiment of the invention as shown on FIG. 4, an RF shield 40 is embedded into the battery such that the energy storage core material 42 of the battery lies between the shielding 40 and the antenna 20. The antenna is grounded to the wireless device's ground circuit by contacts 44 in the same manner as the antenna connection described above. The battery is designed such that the thickness of the energy storage core causes the spacing between the RF shielding and the antenna to be one-quarter of the wavelength of the transmission signal. This tuning of the relationship of the RF shielding to the antenna can be enhanced by the embedding of a layer of dielectric material between the RF shield and the antenna.

The main feature of this design for a battery case is that the antenna for the wireless device is embedded within the battery rather than inside the wireless device. Various configurations of the antenna within the battery case are possible and obvious to any person of ordinary skill in the art.

In the embodiment of this invention wherein an RF shield is embedded into the battery case, only the side of the battery facing the user contains the shielding while the side away from the user is made from non-conducting or low-conductive materials allowing the EM wave to propagate outward towards the cell phone tower without suffering any attenuation.

Incorporation of this RF shield inside the battery will aid in satisfying the FCC requirement limiting the radiation that is directed towards the user's head (Specific Absorption Rate, or SAR). Over time the FCC may tend to lower the permitted SAR level even further. At the same time, as wireless communications technology advances, the cell phone has taken on the function of a hand-held computer with more data-intensive functions, requiring high rates of data transfer to and from the cell phone tower. While it is beneficial to the improved function of cell phones to increase the power output of the antenna, FCC regulations will not allow such an increase in the SAR if the radiation is isotropic. The device of the present invention wherein the radiation is redirected away from the user and towards the base station fulfills both the requirements of the FCC and the technical communication requirements of ever increasing data rates in mobile entertainment and communication devices.

Figure 5:
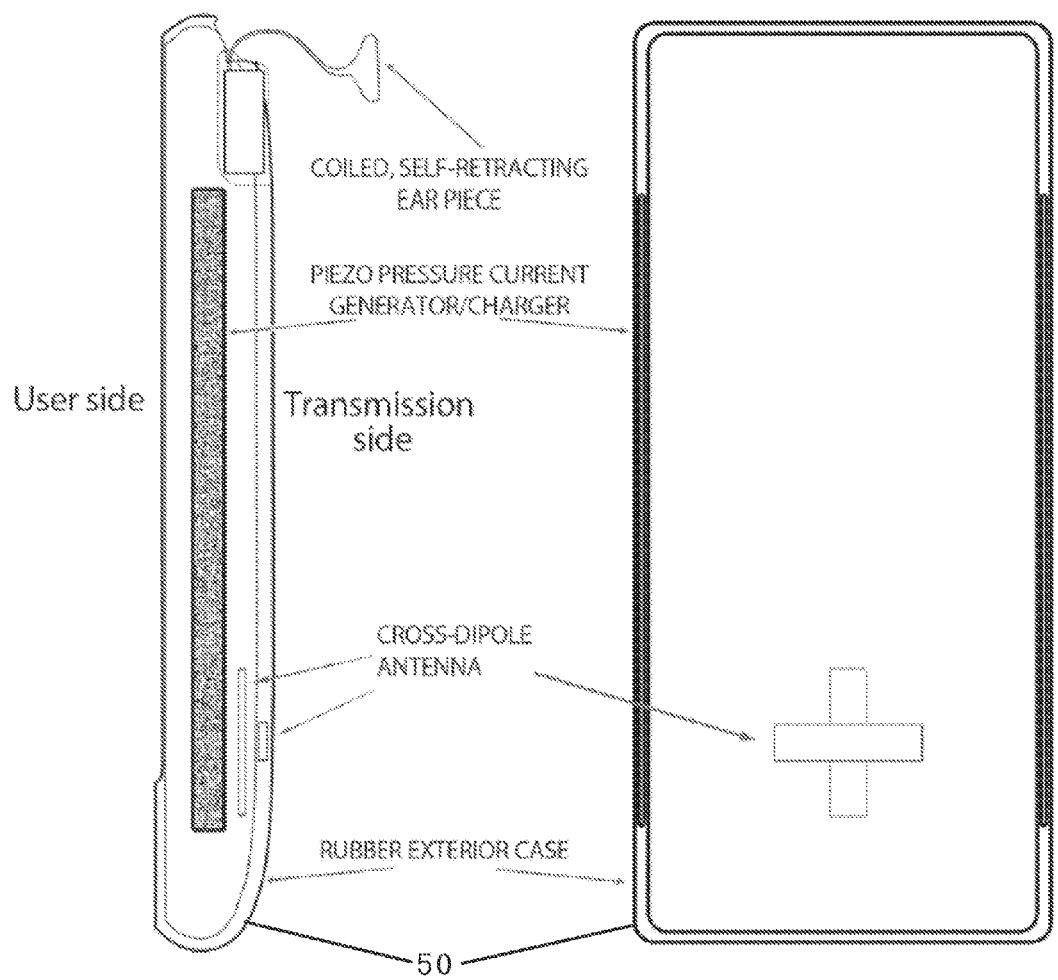
FIG. 5 shows an exploded view of the battery with the antenna, the electrical storage medium, the RF shielding, and the dielectric layers identified, as well as the electrical connections for the battery power, the antenna and the RF shielding ground.

FIG. 5 further illustrates the concept of a "smart" case 50 for a wireless communication device. A smart case is one which is connected to a communication device such as a cell phone through a connector such as the lower multiple pin connectors on the body of the cell phone. It expands the capability of any phone by providing more usable space for a second antenna, a manual charging system, an earpiece (which does not carry RF into the ear), or additional memory in addition to its functioning as a carrying case. Examples of these multiple functions are shown in FIG. 5, although it should be emphasized that there is a great deal of flexibility in the arrangement of these units mentioned above, and the arrangement of FIG. 5 thus is not limiting of the scope of this inventive concept.

The advantage of this smart case is to always improve a given cell phone whose function is to transmit and receive signals, while the case can always upgrade the function of a cell phone. One of the most important functions of such a case is to provide a second antenna which if phased properly will provide the redirection feature without the use of a high-dielectric material. In order to make a multiple band antenna directional it is important to use a phased array so that radiation always will be emitted from one side of the phone.

According to a second aspect of the invention, radiation is coupled from the antenna inside a wireless phone to an external case where the distribution of radiation can be better managed. Several arrangements of directing RF radiation away from the user's head by the appropriate placement of metallic loops and other parasitic elements are presented. This can take the form of arrays of dipole antennas, conducting loops and conducting plates with insulators or dielectrics. The general concept is to couple the radiation from the internal antenna on the side facing the user to the opposite side of the device, where there is sufficient space inside an external case to direct such radiation outward and away from the user. The coupling must be designed to direct the radiation without causing a drop in the output of the external amplifier. From an engineering point of view the impedance seen by the output amplifier should not change. From a physicist's point of view there should be minimum radiation power reflected back on the radiating antenna of the cell phone.

In one preferred embodiment of this aspect of the invention, "coupling antennas" are used to direct radiation from the internal antenna of a wireless phone to a large surface of a carrying case such that there is minimum radiation towards the user and maximum radiation away from the user. It is important to note that this coupling method does not require an actual physical connection between the case and the interior of the phone. However the position of the coupling antenna with respect to the internal antenna is critical. Through a series of coupling loops, Yagi antennas or patch antennas, the radiation is further directed away from the user's head which is absorptive and towards his surroundings for communication to cell towers. The materials used for coupling and re-directional elements are generally made out of materials of high electric conductivities, although dielectric materials are also used to achieve optimal physical spacings.

Figure 6:
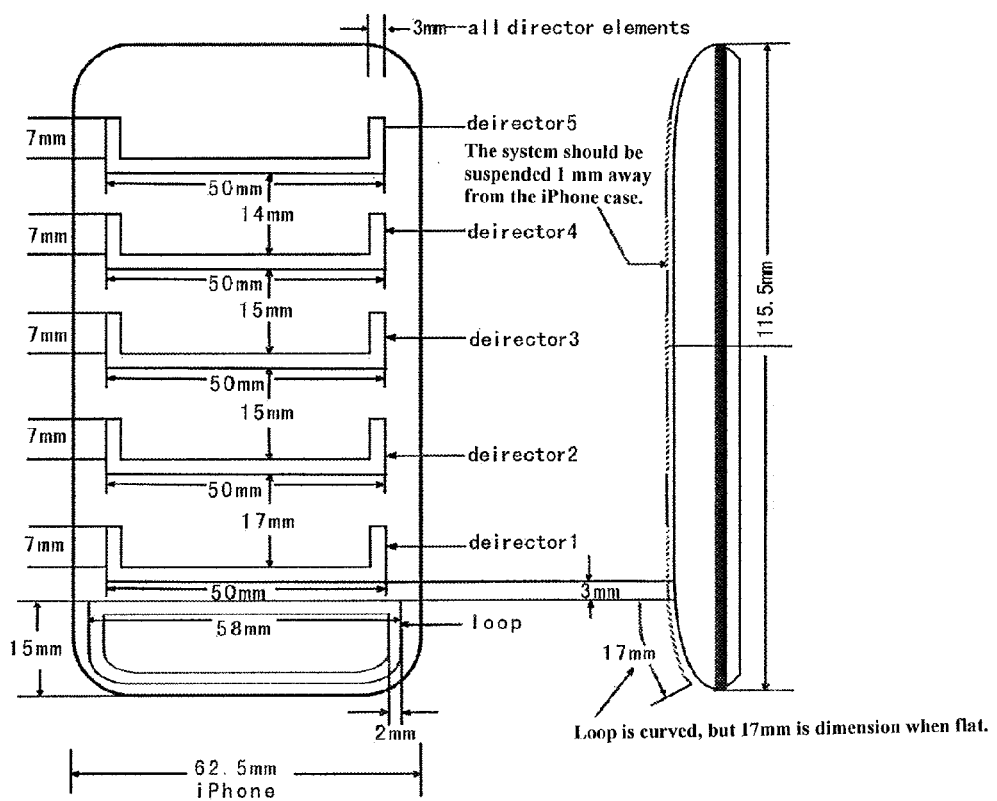
FIGS. 6, 7A and 7B show various views of a protective external wireless phone case provided with a passive coupling antenna incorporated into the back of the case in accordance with a first embodiment.
Figure 7A:
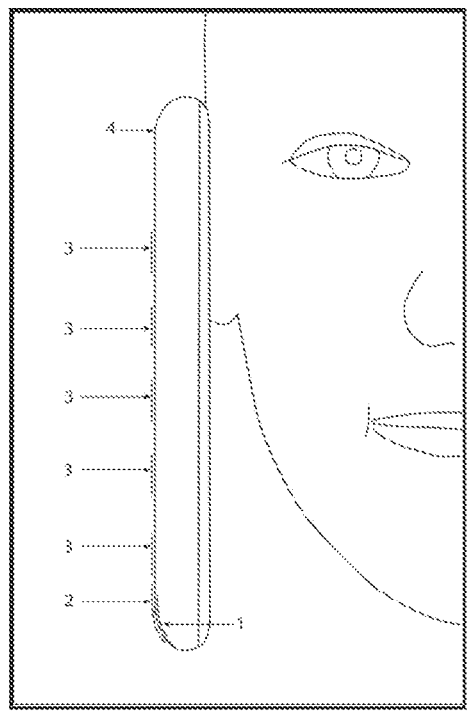
Figure 7B:
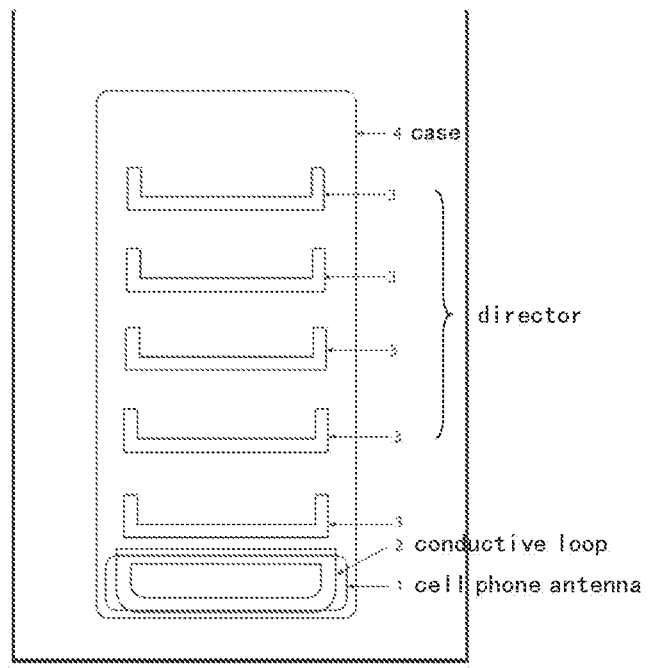

In the preferred embodiment of the invention as shown in FIGS. 6, 7A and 7B, a protective external wireless phone case 4 is provided with a passive coupling antenna (which may be a Yagi, loop or patch antenna) incorporated into the back of the case, on the side away from the user. This antenna works as a directional antenna consisting of an array of a dipole and additional closely coupled parasitic elements (e.g. a reflector 2 and one or more directors 2) and directs the radiation from the internal antenna 1 up, out and away from the phone. In this preferred embodiment the beam antenna may also be substituted by a loop or patch antenna.

Figure 8:
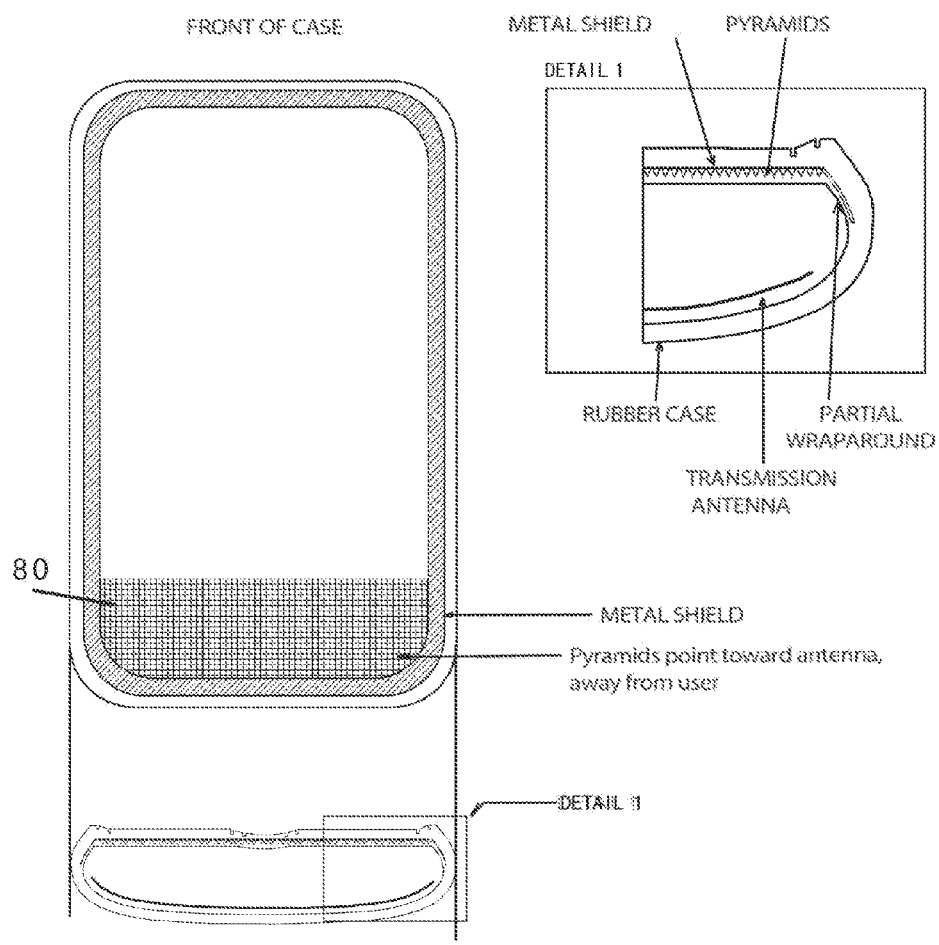
FIG. 8 shows a beam antenna combined with a shield having a metallic surface that is corrugated.

In another embodiment of the invention as shown in FIG. 8, the beam antenna may be combined with a shield 80 comprising a metallic surface that is corrugated, giving rise to many image dipoles, thereby providing a wide pattern of radiation. The particular shape and size of the corrugations is critical, the objective being to disperse the reflected radiation as widely as possible. The corrugations are preferably of comparable size or smaller than the spacing of the shield from the antenna.

Figure 9:
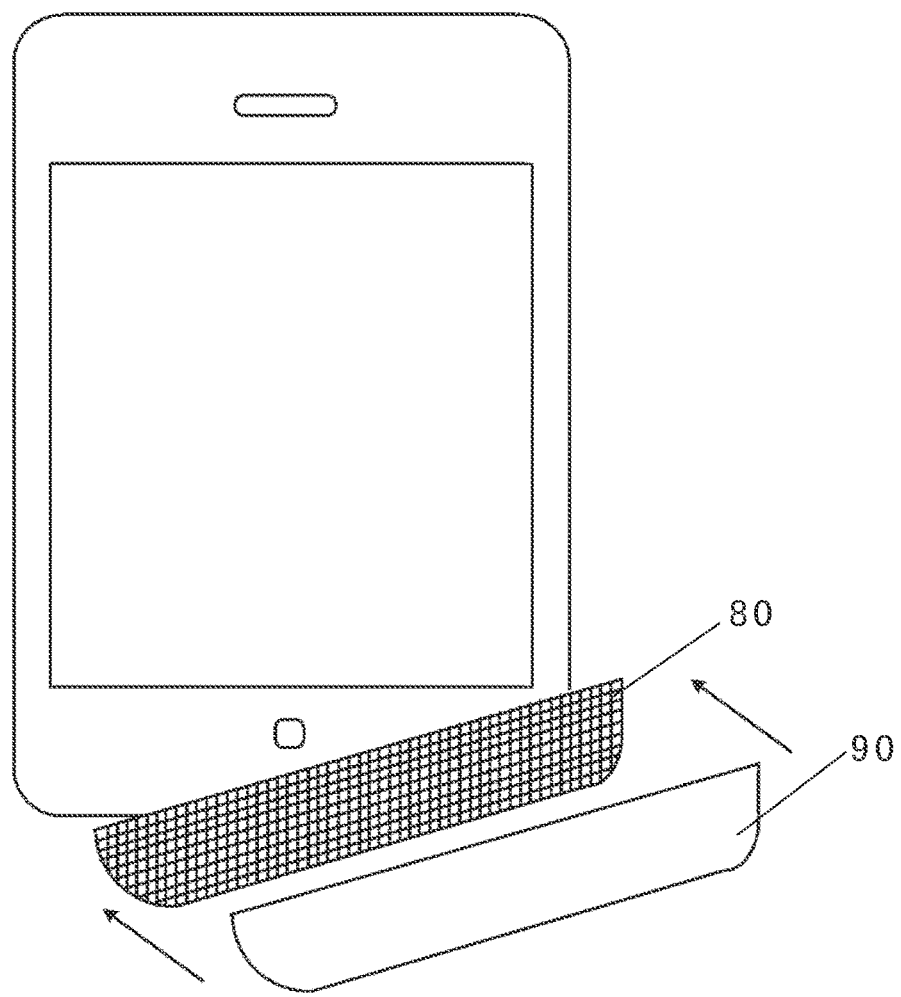
FIG. 9 shows layer of highly conductive corrugated metal shield of a specific design is, optionally, combined with a layer of absorptive material of a specific frequency range.

In an alternate embodiment of the invention as shown in FIG. 9, the layer of highly conductive corrugated metal shield 80 of a specific design is combined with a layer of absorptive material 90 of a specific frequency range, inserted between the internal antenna and the user, such that with the phone inserted into an external case the materials would be placed as indicated.

Figure 10:
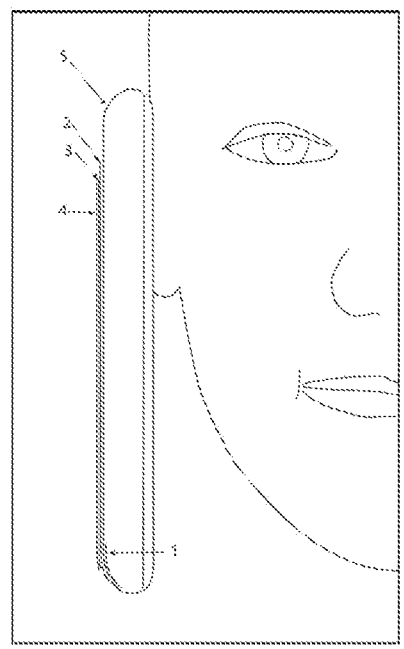
FIGS. 10 and 11 show various views of a protective external wireless phone case provided with a passive coupling antenna incorporated into the back of the case in accordance with a second embodiment.
Figure 11:
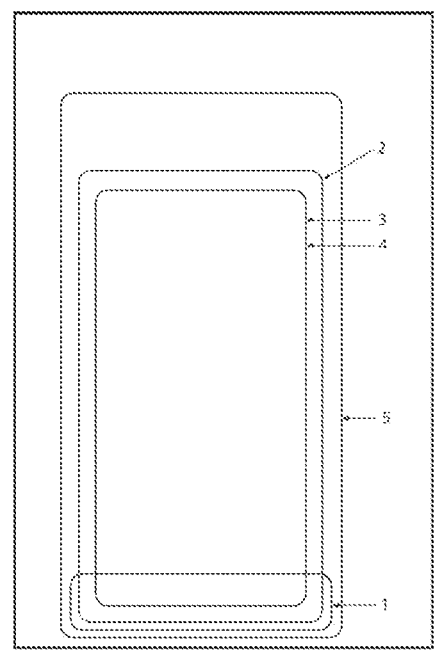

The redirection of RF radiation away from the user's head may also be achieved by the use of a properly located passive beam antenna as shown in FIGS. 10 and 11, with or without the corrugated shield of highly conductive metallic material, and with or without a layer of absorptive material.

A main feature of this invention, whether as a passive directional beam antenna alone, or in combination with a passive re-directional shield incorporated in an external case for a wireless phone, or such combination incorporated internally in a wireless phone device, is that the invention directs/redirects radiation away from the user and out of the phone towards a cell tower, reducing SAR without adversely affecting TRP. It does this with a combination of a directional antenna and re-directive shield integrated within a case of non-conducting or low-conductive materials (variously of silicon, plastic, cloth, etc.) that allow EM waves to propagate outward towards the cell phone tower without suffering any attenuation.

Figure 12:
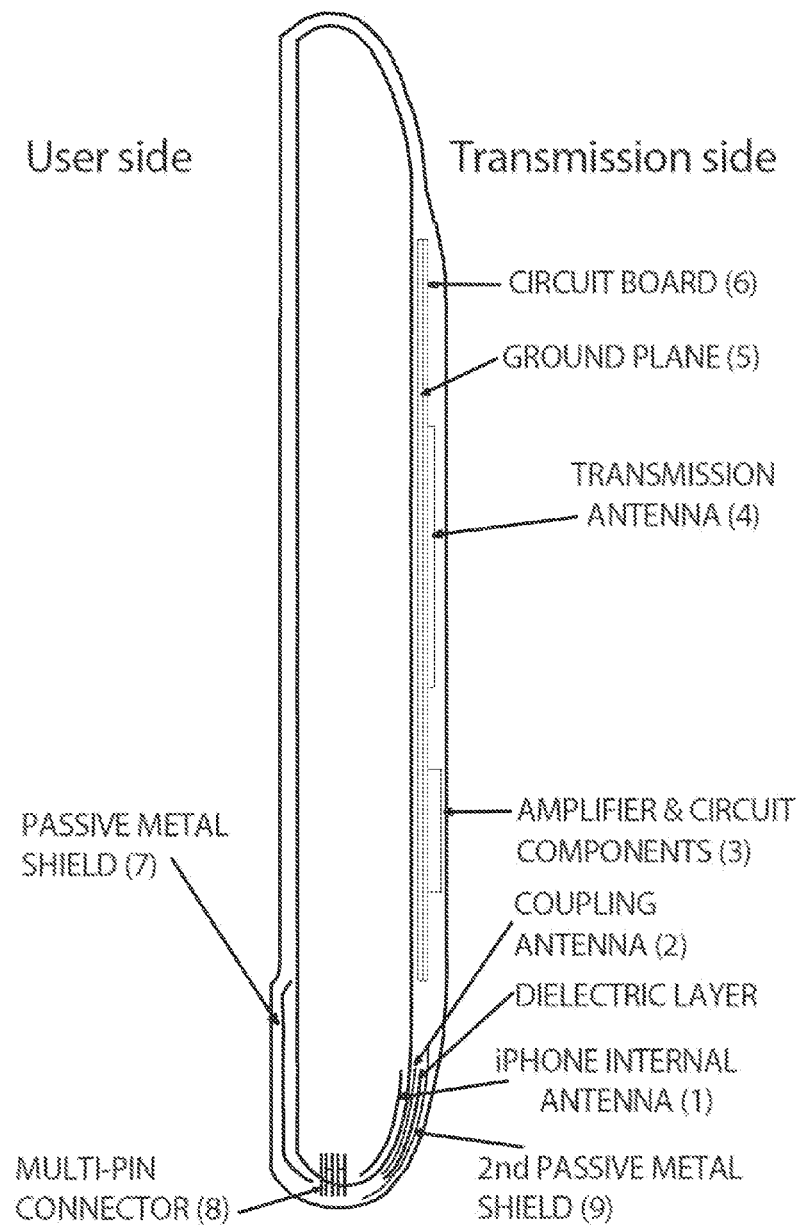
FIG. 12 shows RF redirection material being integrated into the internal design of a wireless device.

The same RF redirection would be the result of the material(s), in these various embodiments, being integrated into the internal design of the wireless device, as shown in FIG. 12.

The invention may also be embodied in an active case, where the power that drives the external antenna embedded in the external case comes from the cell phone's internal battery via the phone's built in power port. The power can also come from solar cells embedded into the external case. It can also come from mechanical motion of a piezoelectric or other similar mechanical to electrical generator.

The invention includes a directional beam-antenna (Yagi, loop or patch) integrated into the external case on the back side of the phone away from the user, floated within the external case with a general tolerance for placement optimally within +/−0.020" (+/−0.5 mm). This antenna works as a directional antenna consisting of an array of a dipole and additional closely coupled parasitic elements (a reflector and one or more directors). These elements are made of specific planar metal material (copper or gold, for example). The dipole in the array is placed over the phone's internal antenna, effectively coupled by proximity and within a specific tolerance of placement, but optimally at 5%, and driven by said internal antenna. Another element, 10% longer, operates as a reflector. Other shorter parasitic elements are added in front of the dipole as directors. Elements arranged optimally at approximately a one-quarter-wavelength mutual spacing and being progressively slightly shorter than a half wavelength, optimally positioned within a 10% tolerance, direct signals of increasingly higher frequencies onto the active dipole. The beam-like antenna has directionality, directing radiation away from the reflector through the driven element and out via the directors in the top of the wireless device, producing a chimney effect.

The directional antenna may also be a loop or patch antenna where said antenna is on the back of the phone, away from the user's head, placed optimally 3 mm below the plane containing the iPhone antenna. The loop is offset along the X-axis so that the edge is between the ground sheet and the antenna element. If a patch antenna is used, the patch director is square in shape, and each side is optimal in length. These are free space lengths, corrected for dielectric constant (velocity factor). The patch director functions like the loop director.

The metallic surface is preferably non-planar so that the electromagnetic waves radiated by antennas are reflected into a widely scattered area. The non-planar surface causes reflections of radiation from a single dipole into a much wider area than a planar surface and a single dipole. The metallic surface may be corrugated, curved, or may be folded.

This highly conductive metal imbedded in the external case to reflect the radiation should be corrugated in a specific way (e.g. rows, chevrons, pyramids), to a specific height and width of corrugation. It should be of a specific thickness; optimally, greater than the skin depth of the EM wave at the cell phone frequency. The metal shield may also be flat. The placement on the face of the wireless phone with respect to the internal antenna(s) is specific.

Another condition for efficiency is that the separation between the metal layer and the enclosed antenna should be occupied by a broadband resonant absorptive material having a specific frequency range that is loaded for predetermined loss tangents and that functions on an impedance matching principle. The material is placed over specific areas to limit radiation to the user. However the case is able to redirect radiation effectively, if not optimally, even when the conditions above are not met.

Although the foregoing features described above deal with antennae located in the lower part of the phone, it will be apparent that the same concept can be applied to antennas located in the upper part or other areas of the phone.

A simplification of applying the radiation redirection and shielding can be by use of adhesive patches applied directly onto the area over the antenna; a first patch over the antenna on the side opposite the user (i.e. toward the cell tower) and a second patch between the antenna and the user. In this embodiment the beam antenna, the highly conducting corrugated shield and, optionally the frequency-targeted resonant absorptive layer, can be sandwiched between two non-conducting layers, one of which contains an adhesive surface to be applied directly onto the phone. The user will receive the protection whether the case is applied over it or not. It is apparent that this simplification can be applied to any case and to any phone. Appropriate covering might be necessary to secure this patch in place for more permanent application.

Incorporation of the Shield During Manufacturing

Instead of a case described above, a passive coupling and redirection unit can be installed inside a wireless device, provided the appropriate spacing is used between this coupling unit and the original cell phone antenna. This is made possible by the fact that both the coupling loop and the Yagi directors can all be lined up in a plane with a thickness of 1-2 mm.

Instead of using a case featuring the above described shield can be built into the wireless device; either the beam antenna, alone, or in combination with the corrugated metallic shield, or in combination with the absorptive frequency targeted, can be incorporated directly within the phone's structure. The plastic/metal housing of the phone facing the user will have a liner with a conducting metal layer and, optionally, an absorptive layer, separating the beam antenna, the metal layer and the internal antenna. This has the advantage that the phone is complete with the shield right from the factory.

Another effective method has emerged that is a hybrid approach, combining the passive redirection with the active driver amplifier and battery in the external case. This method uses the cell phone antenna and power amplifier system as a wireless feed to the amplifier/antenna system inside the external case. The final transmission power is to be radiated from an antenna inside the external case. Therefore, the cell phone system serves only as the low power driver, which couples to the final power amplifier (PA) for final transmission to cell stations. Since the antenna in the case can be a patch antenna with a ground plane occupying a space greater than the radiating antenna, we should expect the radiation pattern to be that of a patch antenna. The radiation pattern is hemispherical and will satisfy our goals of achieving a high directional TRP and at the same time low SAR.

As the base station tower receives a strong signal from the external case antenna, it signals the cell phone to lower its power. The cell phone antenna now radiates only a small amount of energy since it acts only as a low-power drive to the external case system, which is performing all the real transmission work. As the cell phone lowers its power, its radiation towards the user will be correspondingly lower even if a shield is not present. When a shield is included on the user side the radiation towards the user will be further reduced. In fact, the effect of the passive shield of suppressing the TRP of the cell phone's antenna is now an advantage to us, as it will allow the Pong antenna to be the dominant antenna. The efficiency of the cell phone's antenna is no longer critical, as it only needs to communicate with the external case's coupling antenna located a few millimeters away.

This design is, in principle, simple. It substitutes the antenna and PA in the external case for the original cell phone antenna. The external case antenna is directional while the cell phone antenna is isotropic or omni-directional. There is more space in the external case for antenna and RF amplifiers with additional power supplies. Once the cell tower receives the necessary power Pt from the cell phone configuration with the radiating case, it will automatically command the cell phone to emit at a lower level Pi=Pt/A, where A is the gain of the RF amplifier in the case.

Referring to FIG. 12, the cell phone's internal antenna (1) couples with the coupling antenna (2), and the signal is processed by the amplifier circuit (3), driving the external case's transmission antenna (4). Passive metal shields (7) and (9) block RF from the cell phone's antenna, both reducing radiation toward the user and suppressing the antenna's radiated power. The external case circuit draws its power from the cell phone battery through the multi-pin connector (8). This external case embodiment can have its own battery supply, charged through a connector at the bottom of the case while the cell phone's battery is also being charged. However, the system can also function by drawing the power from the cell phone. Since the power draw of the cell phone transmitter will be lowered dramatically and the load shifted to the external case antenna, the net draw of power from the battery should be nearly the same as the standalone cell phone. The amplifier in the external case can be either the same or more powerful than the cell phone. These two batteries are intended to lengthen the period of usage of a wireless phone.

Figure 13:
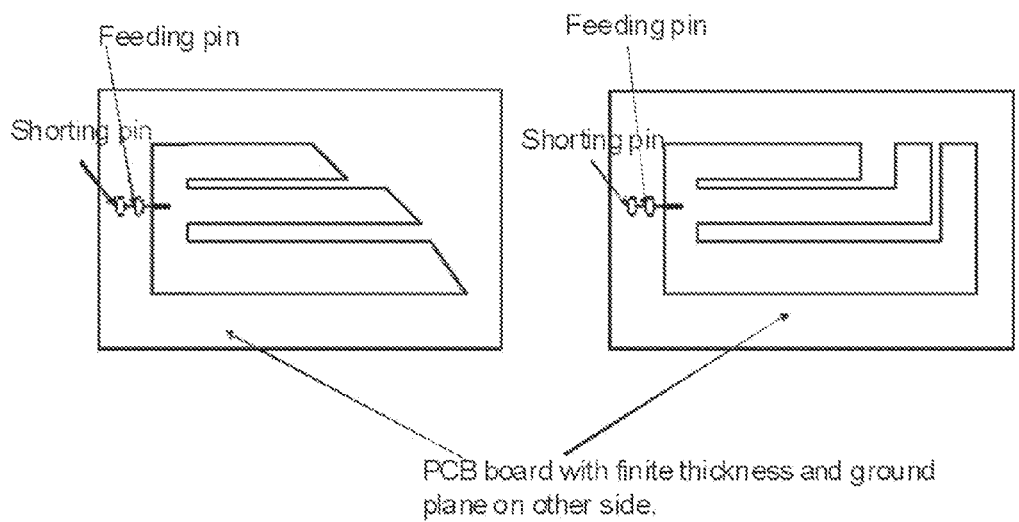
FIG. 13 is a diagram illustrating a multi-band antenna located inside the wireless device, the phase of which can be controlled by a microprocessor to correspond to use of different communication frequency bands.

FIG. 13 shows an additional embodiment using multiband antennae, one on each side of the battery or a suitable large surface such a printed circuit board (PCB) surface inside the device. The relative phase between these two antennae is adjustable through a microprocessor such that the radiation is directed away from the user. The separation between these two antennae can be any distance because of the control of relative phase between these two antennae. The phase between these two antennae can be controlled digitally according to the frequency band being used by the wireless device. The information used for the control of the phase can be obtained from a sensor or detector that determines the frequency band being used. The phase difference between the two antennae is adjusted to optimize minimum power being directed towards the user and directing maximum power away from the user. This digital control allows a multi-band operation with low SAR and acceptable or enhanced TRP. In FIG. 13, the antennae are tri-band antennae and are located on the surface of an internal PCB opposite to a ground plane.

Figure 14:
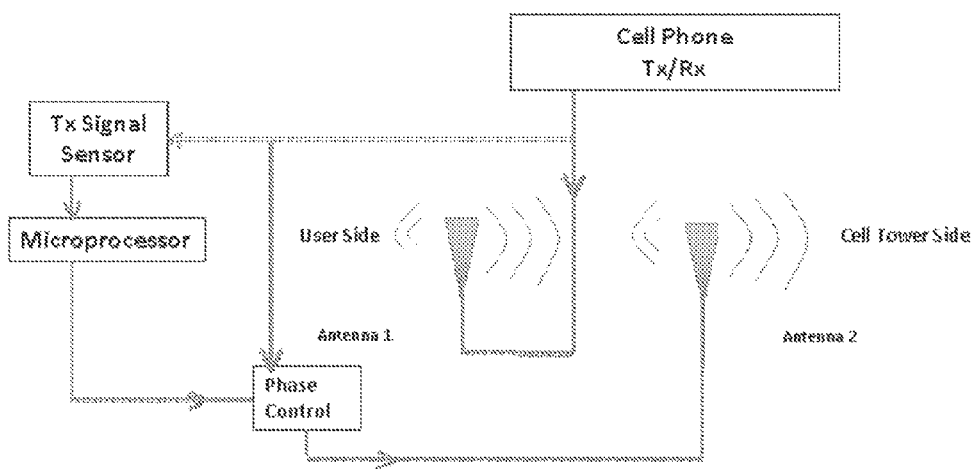
FIG. 14 is a diagram illustrating the use of phase control of antenna propagation to direct electromagnetic radiation in a direction away from the user of the wireless device.

FIG. 14 is a diagram illustrating an embodiment of the use of phase control to control the phase difference between two antennae, Antenna 1 and Antenna 2, so as to redirect radiation in a direction away from the user of the wireless device (cell phone). A transmission signal sensor Tx Signal Sensor detects the signal being sent to the antennae by the transceiver of the cell phone. This Signal Sensor determines the frequency band being used by the cell phone for communication with the cell tower (base station), and sends a corresponding signal to the Microprocessor. The Microprocessor in turn sends a control signal to a phase controller (Phase Control), which controls the phases of the Antenna 1 and Antenna 2 to create a predetermined phase difference between the antennae, appropriate for the particular communication frequency band being used, and directing the radiation from the antennae away from the user.

What is claimed is:

1. An apparatus, comprising:
an external case configured to be coupled to a wireless device having a case separate from the external case,
the external case including an antenna that couples to radiation from an internal antenna of the wireless device when the external case is coupled to the wireless device and the wireless device is operational, the antenna configured to redirect radiation away from a user of the wireless device when the external case is coupled to the wireless device and when the wireless device is operational.

2. The apparatus of claim 1, wherein the antenna is configured to redirect radiation away from the user of the wireless device such that a specific absorption rate (SAR) of the wireless device is reduced without substantially adversely affecting a total radiation power (TRP) of the wireless device.

3. The apparatus of claim 1, wherein the antenna has a plurality of parasitic elements, the plurality of parasitic elements being operatively coupled to the internal antenna of the wireless device when the external case is physically coupled to the wireless device and when the wireless device is operational.

4. The apparatus of claim 1, wherein the antenna is a passive antenna array that includes at least one of (1) loops, (2) Yagi elements, (3) planar antennas, or (4) strip antennas.

5. The apparatus of claim 1, wherein the wireless device is disposed between the external case and the user of the wireless device when the external case is coupled to the wireless device and when the wireless device is operational.

6. The apparatus of claim 1, wherein the antenna includes a plurality of elements that collectively define a directionality of the antenna, the antenna configured to redirect radiation away from the user of the wireless device based on the directionality of the antenna.

7. An apparatus, comprising:
an external case configured to be disposed with a wireless device, the external case having an antenna,
the antenna that couples to radiation from an internal antenna of the wireless device such that a specific absorption rate (SAR) of the wireless device is reduced without substantially adversely affecting a total radiation power (TRP) of the wireless device, when the external case is coupled to the wireless device and when the wireless device is operational.

8. The apparatus of claim 7, wherein the antenna operatively coupled to the internal antenna of the wireless device such that radiation emitted from the internal antenna is redirected away from a user of the wireless device, when the external case is coupled to the wireless device and when the wireless device is operational.

9. The apparatus of claim 7, wherein the antenna has a plurality of parasitic elements, the plurality of parasitic elements being operatively coupled to the internal antenna of the wireless device when the external case is physically coupled to the wireless device and when the wireless device is operational.

10. The apparatus of claim 7, wherein the antenna is a passive antenna array that includes at least one of (1) loops, (2) Yagi elements, (3) planar antennas, or (4) strip antennas.

11. The apparatus of claim 7, wherein the wireless device is disposed between the external case and the user of the wireless device when the external case is coupled to the wireless device and when the wireless device is operational.

12. The apparatus of claim 7, wherein the antenna includes a plurality of elements that collectively define a directionality of the antenna, the antenna operatively coupled to the internal antenna of the wireless device such that radiation emitted from the internal antenna is redirected away from a user of the wireless device based on the directionality of the antenna.

13. A method comprising:
passively coupling radiation, from an internal antenna of a wireless device having a case, at an external case when the external case is coupled to the wireless device and when the wireless device is operational, the external case being separate from the case of the wireless device; and
redirecting the radiation away from a user of the wireless device when the external case is coupled to the wireless device and when the wireless device is operational.

14. The method of claim 13, wherein the redirecting includes redirecting the radiation such that a specific absorption rate (SAR) of the wireless device is reduced without substantially adversely affecting a total radiation power (TRP) of the wireless device.

15. The method of claim 13, wherein the redirecting includes:
reducing a specific absorption rate (SAR) of the wireless device; and
substantially maintaining a total radiation power (TRP) of the wireless device.

16. The method of claim 13, wherein the external case includes an antenna array, the antenna array being operatively coupled to the internal antenna of the wireless device when the external case is physically coupled to the wireless device and when the wireless device is operational.

17. The method of claim 13, wherein:
the external case includes an antenna having a plurality of parasitic elements,
the passively coupling radiation including passively coupling radiation at the plurality of parasitic elements that are operatively coupled to the internal antenna of the wireless device when the external case is physically coupled to the wireless device and when the wireless device is operational.

18. The method of claim 13, wherein:
- the external case includes a passive antenna array that includes at least one of (1) loops, (2) Yagi elements, (3) planar antennas or (4) strip antennas,
- the passively coupling radiation including passively coupling radiation at the passive antenna array that is operatively coupled to the internal antenna of the wireless device when the external case is physically coupled to the wireless device and when the wireless device is operational.

19. The method of claim 13, wherein the wireless device is disposed between the external case and the user of the wireless device when the external case is coupled to the wireless device and when the wireless device is operational.

20. The method of claim 13, wherein:
- the external case includes an antenna having a plurality of elements that collectively define a directionality of the antenna,
- the passively coupling radiation including passively coupling radiation at the antenna that is operatively coupled to the internal antenna of the wireless device when the external case is physically coupled to the wireless device and when the wireless device is operational,
- the redirecting including redirecting radiation away from the user of the wireless device based on the directionality of the antenna.

* * * * *